(12) United States Patent
Bedjaoui et al.

(10) Patent No.: US 10,290,893 B2
(45) Date of Patent: May 14, 2019

(54) METHOD FOR ASSEMBLING AND ENCAPSULATING LITHIUM MICROBATTERIES AND MICROBATTERIES PRODUCED THEREBY

(71) Applicant: COMMISSARIAT A L'ENERGIE ATOMIQUE ET AUX ENERGIES ALTERNATIVES, Paris (FR)

(72) Inventors: Messaoud Bedjaoui, Voreppe (FR); Gabriel Delepierre, Fontaine (FR); Sylvain Poulet, Saint Victor de Cessieu (FR)

(73) Assignee: Commisariat a l'Energie Atomique et aux Energies AlternativesFL (US)

( * ) Notice: Subject to any disclaimer, the term of this patent is extended or adjusted under 35 U.S.C. 154(b) by 49 days.

(21) Appl. No.: 14/403,065

(22) PCT Filed: Jun. 20, 2013

(86) PCT No.: PCT/FR2013/051448
§ 371 (c)(1),
(2) Date: Nov. 21, 2014

(87) PCT Pub. No.: WO2014/006296
PCT Pub. Date: Jan. 9, 2014

(65) Prior Publication Data
US 2015/0188186 A1    Jul. 2, 2015

(30) Foreign Application Priority Data
Jul. 6, 2012 (FR) ..................... 12 56530

(51) Int. Cl.
*H01M 10/04* (2006.01)
*H01M 10/0525* (2010.01)
(Continued)

(52) U.S. Cl.
CPC ... *H01M 10/0472* (2013.01); *H01M 10/0436* (2013.01); *H01M 10/0525* (2013.01);
(Continued)

(58) Field of Classification Search
CPC .......... H01M 10/046; H01M 10/0472; H01M 10/0525
(Continued)

(56) References Cited

U.S. PATENT DOCUMENTS 6,982,132 B1   1/2006   Goldner et al.
8,012,803 B2   9/2011   Gann et al.
(Continued)

FOREIGN PATENT DOCUMENTS

KR    20020017790 A  *  3/2002   ............ H02M 10/36
WO    2009073150 A2     6/2009

OTHER PUBLICATIONS

Machine Translation KR1020020017790 (Year: 2002).*
(Continued)

*Primary Examiner* — Stewart A Fraser
*Assistant Examiner* — Victoria H Lynch
(74) *Attorney, Agent, or Firm* — Forge IP, PLLC

(57) ABSTRACT

A method of vertically assembling encapsulated single microbatteries, wherein the vertical assembly contains, between the microbatteries, an electrical insulation and/or sealing layer and a metal layer, successively including: a step of stacking and attaching at least two single microbatteries, previously encapsulated, stacked on each other; and forming a metal layer, capable of ensuring the electrical coupling of each of the metal layers of each of the encapsulated single microbatteries. Each of the at least two encapsulated single microbatteries is previously prepared by: forming at least one electrical insulation and/or sealing layer over at least a portion of the lateral sides and of the (Continued)

surface including the current collectors of a microbattery including positive and negative electrodes, an electrolyte, and positive and negative current collectors; making the current collectors of the microbattery accessible; and forming a metal layer extending from the current collectors to the lateral sides of said microbattery.

14 Claims, 4 Drawing Sheets

(51) Int. Cl.
| | | |
|---|---|---|
| *H05K 3/28* | (2006.01) | |
| *H05K 3/30* | (2006.01) | |
| *H01M 2/02* | (2006.01) | |
| *H01M 10/0585* | (2010.01) | |
| *H01M 6/40* | (2006.01) | |

(52) U.S. Cl.
CPC ............ *H05K 3/284* (2013.01); *H05K 3/305* (2013.01); *H01L 2224/02371* (2013.01); *H01L 2224/04105* (2013.01); *H01L 2924/0002* (2013.01); *H01M 2/0277* (2013.01); *H01M 2/0287* (2013.01); *H01M 6/40* (2013.01); *H01M 10/0585* (2013.01); *H05K 2203/1305* (2013.01); *Y10T 29/4911* (2015.01); *Y10T 29/49108* (2015.01); *Y10T 29/49114* (2015.01); *Y10T 29/49146* (2015.01)

(58) Field of Classification Search
USPC ............................................ 29/623.1, 632.2
See application file for complete search history.

(56) References Cited

U.S. PATENT DOCUMENTS

| | | | | |
|---|---|---|---|---|
| 2003/0152815 | A1* | 8/2003 | LaFollette | H01M 2/0202 429/7 |
| 2003/0232248 | A1* | 12/2003 | Iwamoto | H01M 4/66 429/233 |
| 2005/0271948 | A1* | 12/2005 | Kang | C08G 77/20 429/302 |
| 2007/0139001 | A1 | 6/2007 | Hahn | |
| 2007/0145579 | A1 | 6/2007 | Hoshino et al. | |
| 2008/0032236 | A1* | 2/2008 | Wallace | H01M 6/40 430/319 |
| 2008/0112150 | A1 | 5/2008 | Jones | |
| 2010/0291431 | A1 | 11/2010 | Shih et al. | |
| 2011/0045635 | A1 | 2/2011 | Gann et al. | |

OTHER PUBLICATIONS

International Search Report Application No. PCT/FR2013/051448 Completed: Aug. 7, 2013; dated Aug. 16, 2013 pp. 3.
E. Meng, et. al. "Plasma removal of Parylene C", Journal of Micromechanics and Microengineering; IOP Publishing Ltd; 2008; pp. 1-13.
F. Almeida, et el., "Reactive ion etching PECVD silicon nitride in SF6 plasma" Journal of Nuclear Materials 200; Elsevier Science Publishers B.V; 1993; pp. 371-374.

\* cited by examiner

METHOD FOR ASSEMBLING AND ENCAPSULATING LITHIUM MICROBATTERIES AND MICROBATTERIES PRODUCED THEREBY

FIELD OF THE INVENTION

The present invention relates to the encapsulation and the assembly of lithium microbatteries.

More particularly, the invention relates to an electric microbattery assembly connection mode providing a robust encapsulation and a good compatibility with the BEOL "Back End of Line" technology (a technology concerning component interconnection operations), thus enabling their electric connection with other individual components (transistors, resistors, etc.).

BACKGROUND OF THE INVENTION

In the context of the integration of devices for microelectronics, microbatteries have the advantage of being capable of adapting to the increasing needs of such applications in terms of voltage and power. Such an adaptation often requires assemblies of single microbatteries by series and/or parallel connection methods.

Thus, a series assembly provides the possibility of modulating the output voltage while a parallel assembly enables to substantially increase the total capacity.

To meet this request, many assembly solutions have been developed.

For example, document U.S. Pat. No. 6,982,132 describes a method of monolithically stacking microbatteries by successive depositions of the active layers (electrodes and electrolyte) on the same substrate. However, this method does not enable to integrate these microbatteries with external circuits due to the absence of electric contacting areas.

Document WO 2009/073150 describes a method of stacking and bonding two single microbatteries positioned on each other. The electric continuity is provided by means of microvias crossing one of the substrates to interconnect the current collectors of the two microbatteries. However, forming and filling the microvias without altering the microbattery performances turn out being very delicate processes. Such difficulties become insuperable when the number of microbatteries to be stacked increases.

It further remains essential to efficiently protect the reactive lithium-based components against oxidizing species particularly oxygen, nitrogen, and water vapor.

Thus, the main difficulty of a "vertical" assembly lies in the forming of specific electric contacts without short-circuiting the lithium microbatteries, while maintaining a mechanical robustness of the sides, as well as a resistance towards oxidization.

To solve these problems, an additional technically-burdensome encapsulation step is sometimes necessary to ensure a robust and complete protection of all the active layers of the oxidizing species.

SUMMARY OF THE INVENTION

The present invention provides a solution for overcoming these difficulties and protecting the lithiated layers of the single microbatteries from air, and generally from any oxidizing entity, while mechanically consolidating the encapsulation of the final system.

The invention first relates to a single microbattery encapsulation method. It also relates to a so-called method of "vertically" assembling a plurality of encapsulated microbatteries, which guarantees a robust and complete final encapsulation and requires electrical interconnection techniques which do not use the constraining microvia technology. The microbatteries thus encapsulated may have different natures.

In the context of this invention, the encapsulation is defined as a series of steps allowing an electric and sealed insulation of the lithium microbatteries, while ensuring the possibility of subsequently electrically connecting them together or to other microelectronic components.

To implement the methods of the invention, a batch of lithium microbatteries (or a single microbattery) may be easily formed on a standard substrate such as silicon and according to the methods described in the state of the art.

The substrate may be rigid, particularly when it is made of silicon, glass, ceramic, or mica, for example. It may also be flexible, particularly when it is made of polyimide, PEN (polyethylene naphthalate), or PET (polyethylene terephthalate), for example.

The substrate advantageously contains no via, that is, no through holes enabling to reach the current collectors from the lower surface of the substrate (surface opposite to that supporting the microbattery).

Generally, the silicon support (substrate) receives on its upper surface the active elements of the microbattery, that is, a positive and negative electrode and electrolyte system, associated with current collectors, connected to the electrodes. Typically, the electrolyte may be supported by an electrode separator.

The lithium microbatteries can then be separated from one another, or "individualized" by cutting techniques such as sawing or scribing breaking or any other technique adapted to microbattery technology.

After the microbatteries have been individualized, chips with lateral silicon sides having no electric protection are obtained.

Thus, a first aspect of the invention relates to a method of encapsulating a lithium microbattery on a support, said microbattery containing positive and negative electrodes, an electrolyte and positive and negative current collectors, comprising the steps of:
  forming an electrical insulation and/or sealing layer over at least a portion of the lateral sides and of the surface comprising the current collectors of the microbattery;
  making the current collectors of the microbattery accessible;
  forming a metal layer extending from the current collectors to the lateral sides of the microbattery. Since the current collectors are not electrically interconnected, the metal layer is discontinuous. In other words, this metal layer is formed on each current collector, to make them accessible at the level of the corresponding lateral side of the microbattery.

According to a specific embodiment, the electrical insulation and/or sealing layer is formed all over the lateral sides and the surface comprising the current collectors of the microbattery. This layer may also cover the substrate surface opposite to the microbattery.

However, when the substrate is electronically insulating, the electrical insulation and/or sealing layer may cover a portion only of the lateral sides and of the surface comprising the current collectors of the microbattery.

The main function of this encapsulation thus is to ensure the electrical insulation and the sealing from species capable of oxidizing active portions of the microbattery, while providing an accessibility of the current collectors, for the subsequent electric connection within an electronic assembly.

The first step of this encapsulation method according to the invention is based on the arranging of a system ensuring the double function of electrical insulation and of sealing on the surface of the microbattery which requires it.

It may be implemented either by a single bifunctional layer, ensuring both the electrical insulation and the sealing, or by an assembly of two layers, respectively ensuring the function of electrical insulation and that of a sealing barrier.

Further, certain lithium microbatteries make the presence of the insulation layer optional. It is thus possible to deposit a single layer which ensures the double sealing and electrical insulation function, with the sole purpose of improving the microbattery performances.

Thus, and according to a first variation, the electrical insulation layer also ensures the sealing function and comprises SiN (silicon nitride) or $Al_2O_3$ (alumina).

According to a second variation, the encapsulation method implements a successive deposition of an electrical insulation layer and of a sealing layer.

The first layer results in an electrical insulation of the single microbattery.

Advantageously, the electrical insulation layer comprises a polymer which is chemically inert with respect to the positive and negative electrodes and the electrolyte.

With the large panel of commercially-available polymers, the selection of the polymer is generally dictated by the parameters which should be favored according to the targeted application.

Thus, the selection of an adapted polymer for lithium microbatteries is essentially conditioned by a physico-chemical compatibility with the active layers, that is, the positive electrode, the electrolyte, and the negative electrode. Thus, the polymer should not react with one of these three microbattery elements.

Preferably, the polymer is compatible with the dry etching method of reactive ion etching or RIE type.

The use of a polymer may advantageously meet the flexibility criteria, defined as the microbattery charge/discharge movement, that is, the migration of lithium between the two electrodes, and a microbattery expansion/contraction movement. Such a flexibility is necessary for a high-performance encapsulation of microbatteries.

The polymer of the electrical insulation layer may thus behave as a buffer layer to absorb the mechanical stress induced by the microbattery volume expansions/contractions.

Advantageously, the polymer is selected from the group comprising an epoxy, parylene, an acrylate, a silicone, and the mixture thereof.

Due to the deposition mode, this layer is generally arranged on the lateral surfaces of the microbattery:
  either in a single step, by evaporation, by dip coating, by atomic layer deposition, or ALD;
  either in two steps, such as for example via a spin coating deposition, by physical vapor deposition or PVD, or also plasma enhanced chemical vapor deposition or PECVD.

Advantageously, the thickness of this layer is selected to be between 1 and 5 micrometers and preferably close to 2 micrometers, to remain compatible with the next steps.

In a preferred embodiment, this type of deposition is performed by thermal evaporation on the entire surface of the microbattery of a parylene layer.

The second layer results in a sealing of the single microbattery.

This second layer really behaves as a tight diffusion barrier against water vapor and is deposited on the assembly formed by the lithium microbattery coated with the electrical insulation layer, according to methods of the state of the art well known by those skilled in the art.

Preferably, the sealing layer comprises a dielectric element selected from the group comprising silicon oxynitride, silicon nitride, silica, alumina, and the mixture thereof.

Preferably, the electrical sealing layer has a thickness in the range from 10 to 500 nanometers, preferably from 50 to 300 nanometers. It can indeed be observed that if this thickness is smaller than 10 nanometers, the required barrier effect is not achieved. As a corollary, if this thickness is greater than 500 nanometers, the mechanical stress of the layers may induce inverse effects on the barrier properties.

According to the selected material, this layer is deposited by the PECVD technique, by CVD or by ALD, so that it covers the entire upper surface of the microbattery, comprising the active elements, as well as its lateral sides.

In a preferred embodiment, this layer is formed by deposition of a silicon oxynitride deposited by PECVD, by a thickness in the order of 300 nanometers.

Preferably, the electrical insulation and/or sealing layer is capable of giving the microbattery a resistivity value at least equal to $10^{12}$ Ohm.cm, which provides a good insulation of the sides.

Advantageously, the electrical insulation and/or sealing layer is capable of giving the microbattery a barrier value at least equal to $10^{-4}$ $g.m^{-2}.j^{-1}$. "Barrier value" designates variable WVTR, for "Water Vapor Transmission Rate" corresponding to the water vapor transmission rates, and characterizing the property of water absorption or diffusion in the barrier layers.

Such a variable may be measured by techniques such as the Calcium test, the Lithium test, or by permeameters available for sale.

The second step of the encapsulation method is intended to allow a partial opening on the electric contacts originating from the electrodes, in other words, to make the current collectors accessible.

Preferably, the current collector accessibility step is carried out by selective etching, advantageously through a mask.

In a particularly preferred embodiment, the selective etching comprises:
  a first step of selective etching with a fluorinated gas plasma;
  a second step of selective etching by a plasma comprising oxygen.

In practice, a work pressure of 1.33 Pa (that is, 10 mTorr), and a 80-Watt power are necessary for 3 minutes in order to perform a first etching by means of a $SF_6$ plasma of a SiN layer having a 300-nanometer thickness.

Advantageously, the second selective etching step is implemented by means of an oxygen $O_2$/fluorinated gas $SF_6$ mixture, by an $O_2/SF_6$ ratio equal to 9:1.

According to another specific embodiment, the second selective etching step is implemented by means of a plasma made of oxygen, $O_2$.

Practically, 15 minutes with an $O_2$ plasma with a working pressure of 1.33 Pa (100 sccm) at 300 Watts are necessary to achieve a complete etching of a parylene layer having a 2-micrometer thickness.

To carry out this step, the etch mask is arranged to only make the current collectors accessible.

The third step of the encapsulation method comprises a metallization of the current collectors and of the lateral sides of the microbattery.

It comprises the deposition in a single step of a discontinuous metal layer continuously covering, on either side of the active microbattery elements, the current collector and the adjacent lateral side.

Advantageously, the metal layer is obtained by isotropic deposition of by atomic layer deposition (ALD).

In practice, this step takes part in the manufacturing of metal contacts, and may be achieved by any type of techniques of isotropic deposition of the thin layers, such as physical vapor deposition or PVD.

It is generally obtained by localization techniques such as mechanical masking or photolithography. For example, an average 200-nanometer thickness of a typical Ti/Au film made of PVD by mechanical masking may guarantee the electric continuity functionality.

Preferably, the metal layer comprises at least one element selected as a non-limiting indication from the group comprising titanium, tungsten, gold, aluminum, silver, nickel, alone or mixed together. However, all metals with resistivity and barrier properties capable of being deposited in a thin film may be implemented.

Advantageously, the metal layer has a thickness in the range from 100 to 500 nanometers. If this thickness is smaller than 100 nanometers, there is a risk of electronic discontinuity. If this thickness is greater than 500 nanometers, there is a risk of mechanical stress and the barrier properties are altered.

Advantageously, the metal layer is capable of giving the microbattery a resistivity at least equal to $10^{-1}$ Ohm.cm.

From a practical point of view, the encapsulation step may be carried out in grouped fashion by judiciously arranging the different single microbatteries in deposition equipment.

A second aspect of the invention relates to an encapsulated microbattery obtained by the above-described method.

A third aspect of the invention relates to a method of vertically assembling previously-encapsulated single microbatteries. Such an assembly comprises, between the microbatteries, an electrical insulation and/or sealing layer and a metal layer. Such an assembly method successively comprises:
- a step of stacking and attaching at least two single microbatteries, previously encapsulated, stacked on each other;
- forming a metal layer, capable of ensuring the electrical coupling of each of the metal layers of each of the encapsulated single microbatteries.

Advantageously, the assembly method is implemented on single microbatteries encapsulated by the above-described encapsulation method.

The first step of this vertical assembly method comprises stacking and attaching the stacked encapsulated single microbatteries. At least two microbatteries are thus stacked on each other, with an interposed binder layer (binding, glue) between the previously-encapsulated microbatteries.

According to the nature of the desired assembly, the encapsulated single microbatteries are positioned on each other in a series or parallel configuration. For example, in case of a parallel assembly, the cathode and anode current collectors of the encapsulated microbatteries are respectively vertically aligned.

Similarly, a judicious coupling of the cathode and anode current collectors enables to achieve series assemblies, by interchanging the contacting areas.

According to a preferred embodiment, the encapsulated microbatteries are bound by means of non-conductive glue and/or of a non-conductive adhesive film.

More preferably still, the gluing is performed with glue comprising a thermal epoxy.

Advantageously, the glue is hardened at a temperature lower than 150° C. compatible with a low thermal budget. Such a temperature is thus lower than the melting temperature of lithium (180° C.).

In practice, the use of the H70S® glue (Epoxy Technology) hardened at 85° C. is adapted for the type of assembly described in the present invention.

According to this technique, a plurality of encapsulated microbatteries may be assembled by a succession of gluing steps, according to the desired power performance.

The second step of this vertical assembly method according to the invention comprises a step of metallizing the encapsulated single microbatteries, previously stacked and attached.

The electric connection of the current collectors of the different encapsulated single microbatteries is obtained by cleverly implementing the same methods described in the third steps of the single microbattery encapsulation method. Thus, the deposition of a metal layer enables to cover the metal layers preexisting on each of the single microbatteries.

PVD has the advantage of providing a deposition both on the lateral sides and on the upper surface, due to the isotropy of this technique.

The implementation of this assembly method thus provides the advantage of having a microbattery system with a high power performance, and totally sealed with respect to oxidizing species.

A fourth aspect of the invention relates to assembled encapsulated microbatteries obtained by the above-described vertical assembly method, that is, a stack of previously and individually encapsulated microbatteries. This stack has, on each of its lateral sides, a metal layer connecting the current collectors of the electrodes of same sign. "Individually encapsulated" means that the microbatteries are encapsulated one by one. In other words, rather than encapsulating the stack of microbatteries, each of the microbatteries is encapsulated. They are advantageously encapsulated according to the above-described encapsulation method, in batches of microbatteries on a same substrate, or microbattery by microbattery.

Thus, methods of encapsulation and vertical assembly according to the invention meet all the requirements of lithium microbatteries, that is:
- total encapsulation of the sides and of the surface comprising the active elements;
- easy implementation;
- compatibility and ease of connection with external circuits.

BRIEF DESCRIPTION OF THE DRAWINGS

Other advantageous aims and aspects of the invention will better appear from the reading of the following detailed description, provided as a non-limiting indication in relation with the accompanying drawings, among which.

DETAILED DESCRIPTION OF THE INVENTION

Figure 1:
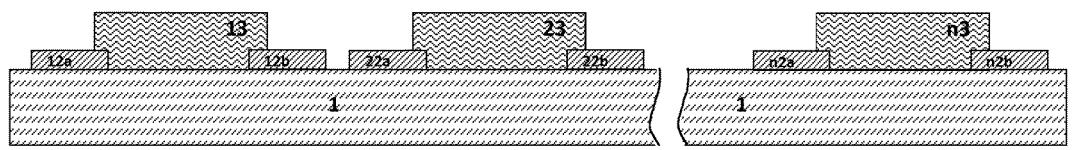
FIG. 1 shows a vertical cross-section view of a batch of microbatteries, horizontally arranged in linear fashion.

A batch of microbatteries is formed in a silicon support (1). On the upper surface of this support are arranged the active elements of the lithium microbattery, that is, the positive electrode, the negative electrode, and the electrolyte, shown in the form of a single element (13, 23, n3) (FIG. 1). Each of the elements is bordered on each side with a current collector (12, 22, n2), including an anode current collector (12a, 22a, n2a) and a cathode current collector (12b, 22b, n2b).

Figure 2:
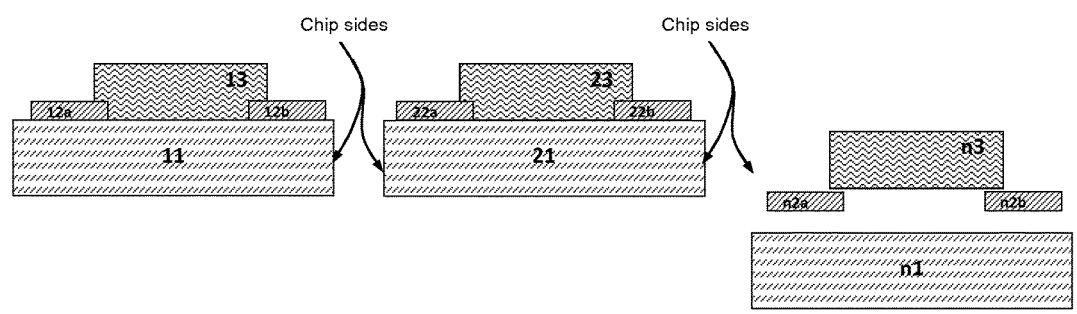
FIG. 2 shows a vertical cross-section view of single microbatteries, that is, microbatteries dissociated from the linear batch; each contains, on an appropriate support, a central element and lateral current collectors.
Figure 3:
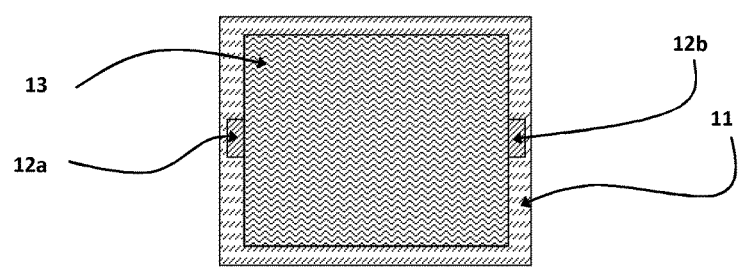
FIG. 3 shows a top view of a single microbattery, showing a central element, lateral current collectors on a support.

The sawing into single microbatteries exposes lateral sides (FIG. 2). A top view of the microbattery illustrates the central position of the active elements (13) at the center of the support (1), and bordered on each side, at the level of the adjacent lateral sides, by the current collectors (12a and 12b) (FIG. 3).

The method of encapsulating a single microbattery is now described in relation with FIGS. 4 to 8.

Figure 4:
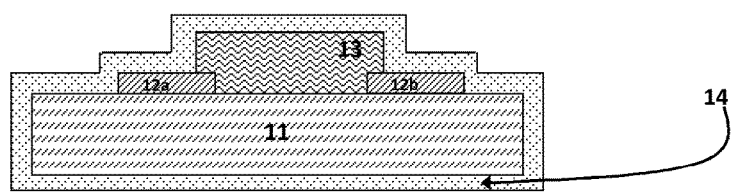
FIG. 4 shows a vertical cross-section view of a single microbattery, which is totally covered on each of its surfaces with an insulation and/or sealing layer.

The first step of the encapsulation method comprises depositing an electrical insulator layer (14), for example, on each of the microbattery surfaces, thus protecting the active elements (13), the current collectors (12a and 12b), and the adjacent lateral sides (FIG. 4).

Figure 5:
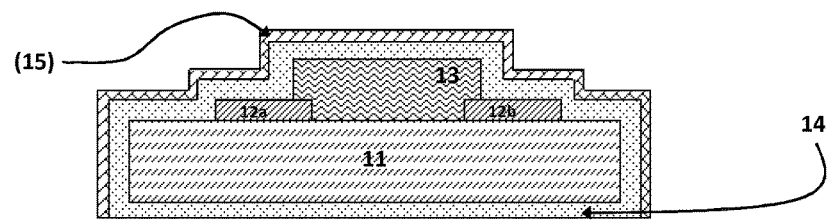
FIG. 5 shows a vertical cross-section view of a single microbattery having undergone the deposition of a sealing layer all over the upper surface and the lateral sides.

The second step of the encapsulation method comprises depositing a sealing layer (15), for example, protecting the upper surface and the lateral sides of the microbattery against attacks particularly originating from water vapor and oxygen (FIG. 5).

Figure 6:
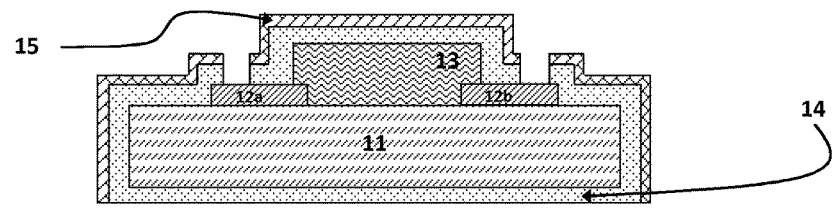
FIG. 6 shows a vertical cross-section view of a single microbattery having been submitted to a selective etching in order to make the current collectors accessible.

A step of selective etching is implemented, to make the current collectors (12a and 12b) accessible, at the level of the upper surface of the microbattery (FIG. 6). Thus, there is no further electrical insulation layer or sealing layer in this location.

Figure 7:
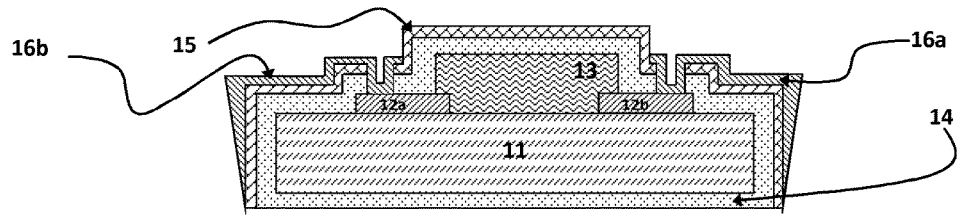
FIG. 7 shows a vertical cross-section view of a single microbattery, which is covered with a metal layer all over the current collectors, over a portion of the upper surface, and all over the lateral sides.

The encapsulation method according to the invention ends with a step of depositing a discontinuous metal layer, on a portion of the upper surface and on the two lateral sides of the microbattery, thus electrically connecting each current collector (12a and 12b) to the adjacent lateral side (FIG. 7).

Figure 8:
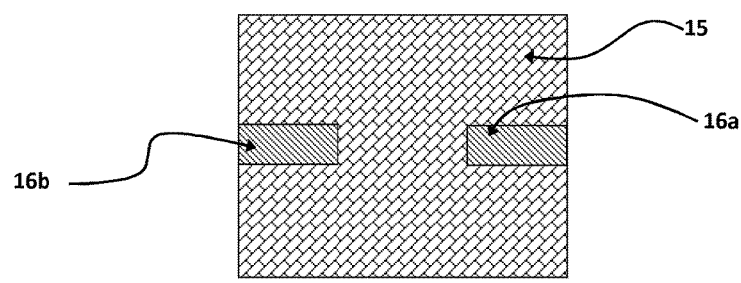
FIG. 8 shows a top view of a microbattery, for which the sealing layer covers the entire microbattery, except for the current collectors and for the region extending from the current collectors to the adjacent lateral sides, which are covered with a metal layer.

FIG. 8 illustrates the nature of the external structure of the upper surface of the microbattery at the end of this step. The upper surface is coated with a sealing layer (15), except at the level of the region extending from the current collectors (12a and 12b) to the lateral sides of the microbattery, which has a discontinuous metal layer (16a and 16b) deposited thereon.

Figure 9:
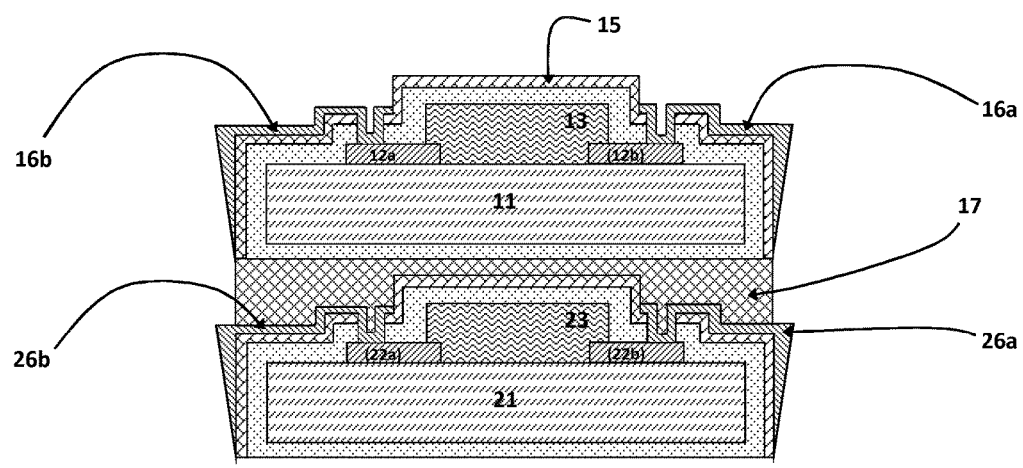
FIG. 9 shows a vertical cross-section view of two encapsulated microbatteries, vertically attached to each other by means of glue.
Figure 10:
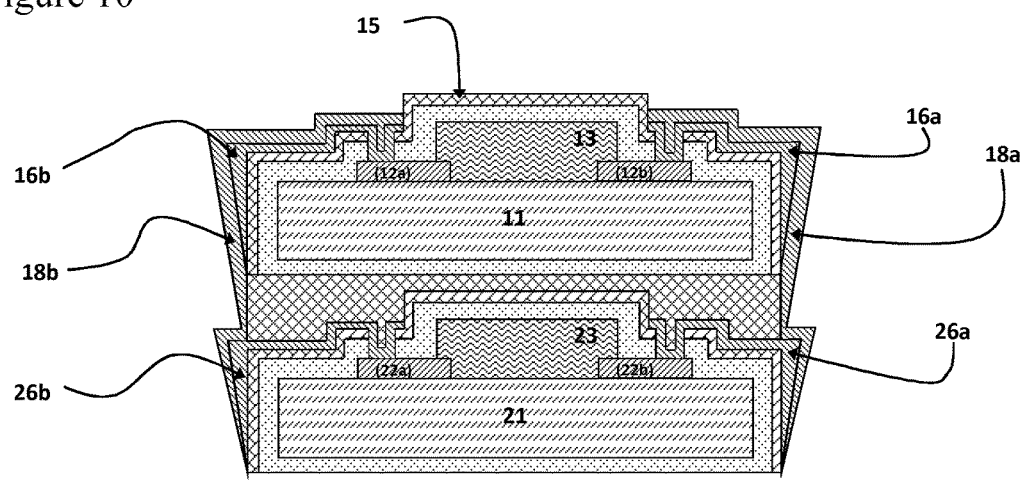
FIG. 10 shows a vertical cross-section view of two microbatteries attached to each other after the deposition of a metal layer which ensures the electrical coupling of the current collectors of each of the microbatteries.

The method of stacking and encapsulating two microbatteries according to the invention is now described in relation with FIGS. 9 and 10.

Two encapsulated microbatteries are vertically stacked and rigidly attached to each other, or bound to each other by a thermal glue layer, for example non-conductive (17) (FIG. 9). The discontinuous metal layers (16a and 26a) and (16b and 26b) on both sides on each of the microbatteries are not in contact.

The second step of this method comprises depositing a discontinuous metal layer (18a and 18b) over a portion of the upper surface and the respective lateral sides defined by the stack. The discontinuous metal layer (18a and 18b) covers the metal layers (16a and 26a) and (16b and 26b) on each side, on each of the single microbatteries. Thus, at the end of this vertical assembly method, the current collectors (12a and 22a), on one side, and (12b and 22b), on the other side, are now connected to one another.

The different layers which result from the implementation of these 2 methods provide:

- a good electrical insulation of the active microbattery elements, thus avoiding the occurrence of short-circuits;
- a good sealing of the microbattery against attacks resulting from water vapor and oxidizing species;
- an easy connection of the current collectors to other electronic elements, which makes them compatible with the back-end technology;
- a robustness of the sides of the assembled microbatteries, enabling to stack a significant number of single microbatteries.

The invention claimed is:

1. A method of vertically assembling encapsulated single microbatteries, said vertical assembly containing between the microbatteries at least one of an electrical insulation and sealing layer and a metal layer that contacts at least two microbatteries, said assembly method successively comprising the steps of:
   (a) stacking and attaching at least two single microbatteries, previously and individually encapsulated, stacked on each other;
   (b) forming a metal layer that contacts at least two microbatteries, ensuring the electrical coupling of each of the metal layers of each of the individually encapsulated single microbatteries;
   wherein each of the at least two individually encapsulated single microbatteries is prepared prior to the stacking step (a) by:
   (i) forming at least one of an electrical insulation and sealing layer over at least a portion of lateral sides and of a surface comprising the current collectors of said single microbattery comprising positive and negative electrodes, an electrolyte, and positive and negative current collectors;
   (ii) making the current collectors of said microbattery accessible;
   (iii) forming a metal layer extending from the current collectors of said single microbattery to the lateral sides of said microbattery, wherein the metal layer is a discontinuous metal layer contacting the current collectors of said single microbattery;

wherein each single microbattery comprises only one positive electrode, only one electrolyte and only one negative electrode, wherein, prior to the stacking step (a), each single microbattery is formed on a substrate that does not contain any via, wherein each substrate is not a current collector of said microbattery;

wherein the metal layer formed in step (iii) is a discontinuous metal layer deposited on a portion of an upper surface and on two lateral sides of the microbattery, thus electrically connecting each current collector to the adjacent lateral side;

and wherein the positive and negative current collectors within each single microbattery are not electrically interconnected within said single microbattery.

2. The method of vertically assembling encapsulated single microbatteries of claim 1, wherein the attaching of the encapsulated single microbatteries is performed by means of at least one of non-conductive glue and a non-conductive adhesive film, interposed between two consecutive microbatteries of the stack.

3. The method of vertically assembling encapsulated single microbatteries of claim 2, wherein the gluing is performed with glue comprising a thermal epoxy.

4. The method of vertically assembling encapsulated single microbatteries of claim 1, wherein the electrical insulation and sealing layer is formed by the successive deposition of an electrical insulation layer and of a sealing layer.

5. The method of vertically assembling encapsulated single microbatteries of claim 1, wherein the electrical insulation layer comprises a polymer selected from the group consisting of an epoxy, parylene, an acrylate, a silicone, and mixtures thereof.

6. The method of vertically assembling encapsulated single microbatteries of claim 1, wherein the electrical insulation layer has a thickness in the range from 1 to 5 micrometers.

7. The method of vertically assembling encapsulated single microbatteries of claim 1, wherein the sealing layer comprises at least one dielectric element selected from the group consisting of silicon oxynitride, silicon nitride, silica, alumina, and mixtures thereof.

8. The method of vertically assembling encapsulated single microbatteries of claim 1, wherein the sealing layer has a thickness in the range from 10 to 500 nanometers.

9. The method of vertically assembling encapsulated single microbatteries of claim 1, wherein the step of accessibility of the current collectors is carried out by selective etching.

10. The method of vertically assembling encapsulated single microbatteries of claim 9, wherein the selective etching comprises:
a first step of selective etching with a fluorinated $SF_6$ gas plasma; and
a second step of selective etching by a plasma comprising oxygen.

11. The method of vertically assembling encapsulated single microbatteries of claim 1, wherein the metal layer formed in step (iii) is obtained by isotropic deposition, or by atomic layer deposition.

12. The method of vertically assembling encapsulated single microbatteries of claim 1, wherein the metal layer formed in step (iii) comprises at least one element selected from the group consisting of titanium, tungsten, gold, silver, aluminum, and nickel.

13. The method of vertically assembling encapsulated single microbatteries of claim 11, wherein the metal layer formed in step (iii) has a thickness in the range from 100 to 500 nanometers.

14. A vertical stack of individually encapsulated microbatteries, obtained by the method of claim 1.

* * * * *